(12) United States Patent
Kato et al.

(10) Patent No.: US 9,006,879 B2
(45) Date of Patent: Apr. 14, 2015

(54) SEMICONDUTOR DEVICE PACKAGE PLACED WITHIN FITTING PORTION OF WIRING MEMBER AND ATTACHED TO HEAT SINK

(75) Inventors: Masaki Kato, Chiyoda-ku (JP); Masahiko Fujita, Chiyoda-ku (JP); Kazuyasu Sakamoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 451 days.

(21) Appl. No.: 12/908,500

(22) Filed: Oct. 20, 2010

(65) Prior Publication Data

US 2011/0254148 A1    Oct. 20, 2011

(30) Foreign Application Priority Data

Apr. 15, 2010    (JP) .................................. 2010-093925

(51) Int. Cl.
*H01L 23/40*    (2006.01)
*H05K 1/02*    (2006.01)
(Continued)

(52) U.S. Cl.
CPC ............ *H05K 1/021* (2013.01); *H01L 23/4093* (2013.01); *H01L 23/36* (2013.01); *H05K 1/184* (2013.01); *H05K 2201/0397* (2013.01); *H05K 2201/09118* (2013.01); *H05K 2201/09827* (2013.01); *H05K 2201/10166* (2013.01); *H05K 2201/10689* (2013.01); *H01L 2924/0002* (2013.01)

(58) Field of Classification Search
CPC ...... H01L 23/36; H01L 23/40; H02K 11/042; H02K 11/044; H02K 11/048; H05K 1/021

USPC .................. 257/706, 712, 718–720, 692, 707
See application file for complete search history.

(56) References Cited

U.S. PATENT DOCUMENTS

| 8,299,666 B2 * | 10/2012 | Shirakata et al. ........... 310/68 R |
| 2008/0211331 A1 | 9/2008 | Dubuc et al. |
| 2009/0081894 A1 * | 3/2009 | Liao et al. ...................... 439/81 |

FOREIGN PATENT DOCUMENTS

| JP | 04-023193 | 1/1992 |
| JP | 05-97080 U | 4/1993 |
| JP | 05-55415 A | 5/1993 |

(Continued)

OTHER PUBLICATIONS

Japanese Office Action dated May 29, 2012 for corresponding Application No. JP 2010-093925.

(Continued)

*Primary Examiner* — Anh Mai
(74) *Attorney, Agent, or Firm* — Sughrue Mion, PLLC

(57) ABSTRACT

The invention is to provide a semiconductor apparatus configured to position a semiconductor device reliably and easily without having a protruding portion formed in the bottom surface of the semiconductor device in the semiconductor apparatus. A semiconductor apparatus is fabricated by attaching a semiconductor device of a surface mount package type and a wiring member to a heat sink. A fitting portion in which the semiconductor device is fit is provided to the wiring member, so that the semiconductor device is positioned by fitting the semiconductor device into the fitting portion provided to the wiring member. According to the semiconductor apparatus of the invention, it becomes possible to position the semiconductor device at a high degree of accuracy.

10 Claims, 4 Drawing Sheets

(51) Int. Cl.
  *H01L 23/36* (2006.01)
  *H05K 1/18* (2006.01)

(56) References Cited

FOREIGN PATENT DOCUMENTS

| JP | 6-268086 A | 9/1994 |
| JP | 07-086456 A | 3/1995 |
| JP | 08-264910 | 10/1996 |
| JP | 10-275665 A | 10/1998 |
| JP | 2008-543266 A | 11/2008 |
| JP | 2009-232656 * 10/2009 ............ H02K 11/00 |

OTHER PUBLICATIONS

Japanese Office Action dated Sep. 25, 2012 issued in corresponding Japanese Patent Application No. 2010-093925.

* cited by examiner

the amount of material used in this case is higher than usual …

SEMICONDUTOR DEVICE PACKAGE PLACED WITHIN FITTING PORTION OF WIRING MEMBER AND ATTACHED TO HEAT SINK

BACKGROUND OF THE INVENTION

1. Field of the Invention

The present invention relates to a semiconductor apparatus including, for example, a semiconductor device of a surface mount package type.

2. Description of the Related Art

In a semiconductor apparatus in the related art, a protruding portion is provided to the bottom surface of a semiconductor device of a surface mount package type (hereinafter, referred to as the semiconductor device) and a fitting hole in which the protruding portion is fit is made in a printed circuit board or a heat sink on which the semiconductor device is mounted. This semiconductor apparatus is structured in such a manner that the semiconductor device is attached and positioned by fitting the protruding portion of the semiconductor device into the fitting hole made in the printed circuit board or the heat sink on the mounting side. Examples are disclosed in JP-A-6-268086 and JP-T-2008-543266 (Japanese Patent Application No. 2008-514162) (the term, "JP-T", as used herein means a published Japanese translation of a PCT patent application).

In the semiconductor apparatus in the related art described above, the protruding portion is provided to the bottom surface of the semiconductor device. This configuration, however, makes it difficult to provide the protruding portion for a semiconductor device having an electrode or a heat spreader that spreads out heat generated at the semiconductor device on the bottom surface thereof.

Also, because it is necessary to drill the fitting hole in the printed circuit board or the heat sink on which the semiconductor device is mounted, there is a problem that the number of working steps is increased.

Further, in the step of attaching the semiconductor device, there is another problem that it is difficult to determine whether the protruding portion of the semiconductor device has been inserted reliably into the fitting hole when viewed from the top surface of the semiconductor device.

In particular, in the case of a semiconductor apparatus in which the semiconductor device is mounted on the heat sink, the semiconductor device is positioned by the protruding portion in the bottom surface of the semiconductor device and the fitting hole in the heat sink and a wiring member of the semiconductor device is also positioned with respect to the heat sink in the same manner.

More specifically, connection terminals of the semiconductor device are positioned via the heat sink with respect to the wiring member to which the connection terminals are to be connected. This configuration raises a problem that high-accurate positioning is difficult to achieve.

SUMMARY OF THE INVENTION

The invention was devised to solve the problems discussed above and is to provide a semiconductor apparatus configured to position a semiconductor device reliably and easily without having a protruding portion formed in the bottom surface of the semiconductor device in the semiconductor apparatus.

A semiconductor apparatus according to an aspect of the invention includes a semiconductor device of a surface mount package type and a wiring member both attached to a heat sink, and a fitting portion in which the semiconductor device is fit is provided to the wiring member, so that the semiconductor device is positioned by fitting the semiconductor device in the fitting portion provided to the wiring member.

According to the semiconductor apparatus of the invention, it becomes possible to position the semiconductor device at a high degree of accuracy. Moreover, assembly performance is enhanced because assembling is carried out by confirming the positioning portion. It thus becomes possible to obtain a semiconductor apparatus capable of reducing the occurrence of deficient mounting of the semiconductor device.

The foregoing and other objects, features, aspects and advantages of the present invention will become more apparent from the following detailed description of the present invention when taken in conjunction with the accompanying drawings.

DETAILED DESCRIPTION OF THE INVENTION

First Embodiment

Figure 1:
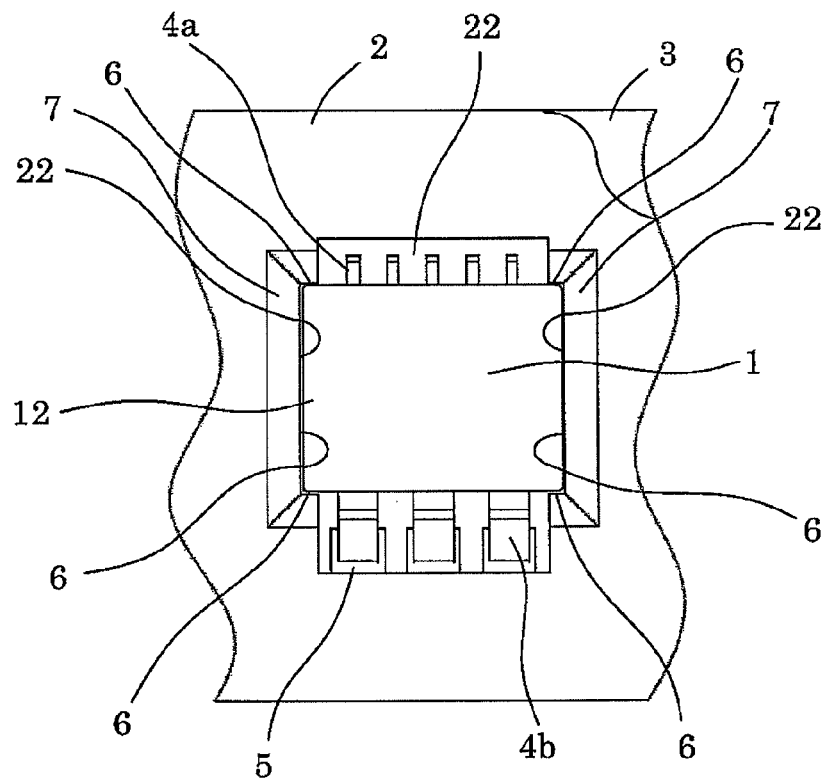
FIG. 1 is a plan view of a semiconductor apparatus according to a first embodiment of the invention.
Figure 2:
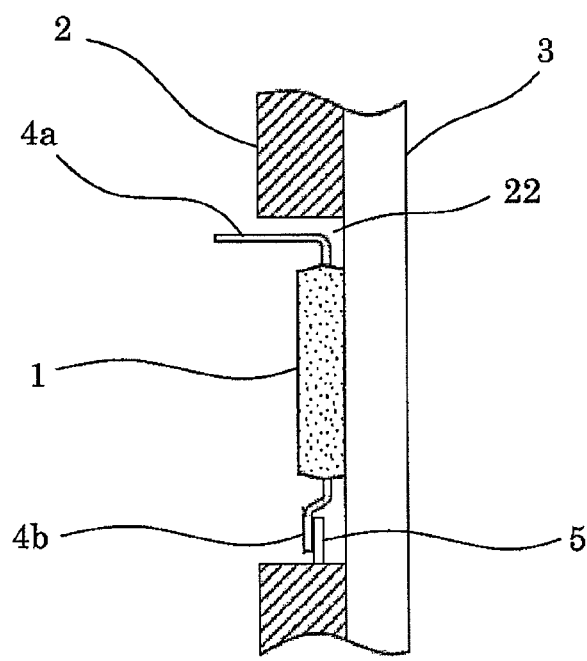
FIG. 2 is a longitudinal cross section of the semiconductor apparatus according to the first embodiment of the invention.
Figure 3:
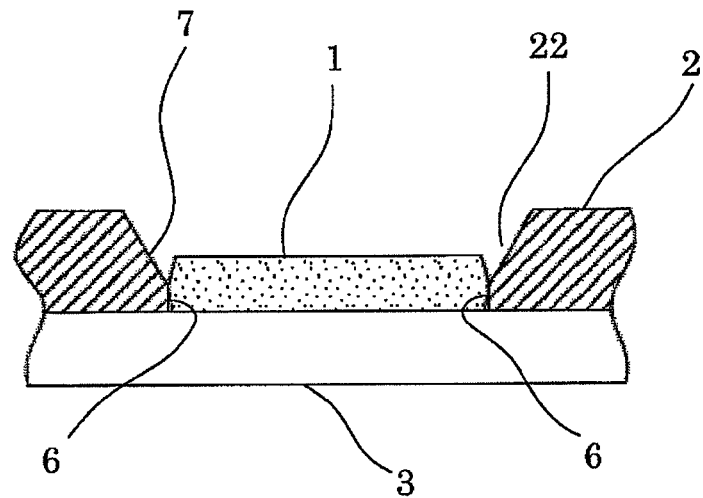
FIG. 3 is a transverse cross section of the semiconductor apparatus according to the first embodiment of the invention.

Hereinafter, a first embodiment of the invention will be described on the basis of FIG. 1 through FIG. 3, and descriptions will be given by labeling same or equivalent members and portions with same reference numerals in the respective drawings. FIG. 1 is a plan view of a semiconductor apparatus according to a first embodiment of the invention. FIG. 2 is a longitudinal cross section of the semiconductor apparatus according to the first embodiment of the invention. FIG. 3 is a transverse cross section of the semiconductor apparatus according to the first embodiment of the invention.

Referring to FIG. 1 through FIG. 3, the semiconductor apparatus according to the first embodiment of the invention includes a semiconductor device 1, a wiring member 2, and a heat sink 3. The semiconductor device 1 in the semiconductor apparatus is of a surface mount package type and it has a flat package main body 12 made of resin. Although it is not shown in the drawings, a semiconductor device chip is attached inside the package main body 12 and a large number of leads made of a metal material and electrically connected to the semiconductor device chip are made up of outer leads 4a and 4b extending, respectively, in two directions from the side surfaces of the package main body 12.

The wiring member 2 to which is connected the semiconductor device 1 is formed by molding an electric wire made of electrically conductive metal in insulating resin. The wiring member 2 is provided with fitting portions 22 in which the semiconductor device 1 is fit. By fitting the semiconductor device 1 into the fitting portions 22 provided to the wiring member 2, the semiconductor device 1 is positioned at a high degree of accuracy.

The heat sink 3 to which are attached the semiconductor device 1 and the wiring member 2 is made of metal having a high heat conductivity, such as aluminum and copper, to spread out heat generated at the semiconductor device 1.

The semiconductor apparatus configured as above is fabricated as follows. That is, after the wiring member 2 provided with the fitting portion 22 is attached to the heat sink 3, the semiconductor device 1 is placed on the heat sink 3 by fitting the side surfaces of the package main body 12 of the semiconductor device 1 into guide portions 16 of the fitting portions 22 of the wiring member 2 and fixed with a preliminarily applied high heat-conducting adhesive. In this instance, by providing tapered portions 7 to the guide portions 6 of the fitting portions 22 of the wiring member 2 at positions at which the semiconductor device 1 comes in contact with the guide portions 6, the semiconductor device 1 can be introduced inside quite smoothly. The workability can be thus enhanced.

The outer leads 4b serving as the leads of the semiconductor device 1 and electrodes 5 of the wiring member 2 are electrically connected to each other by soldering or welding.

As has been described, in the semiconductor apparatus of the first embodiment, as the outer leads 4b and the electrodes 5 of the wiring member 2 are joined together, they are directly positioned by the mutually opposing side surfaces of the package main body 12 of the semiconductor device 1 and the guide portions 6 of the fitting portion 22 of the wiring member 2. The semiconductor device 1 can be therefore positioned at a high degree of accuracy. Hence, not only does it become possible to reduce the occurrence of deficient mounting of the semiconductor device 1, but it also becomes possible to enhance the joining accuracy and the joining workability because an amount of displacement at the joining position is extremely so small that the joining can be carried out easily.

Also, because the semiconductor device 1 is positioned by the side surfaces of the package main body 12, the bottom surface of the semiconductor device 1 can be flat. It thus becomes possible to secure a larger heat transfer area of the semiconductor device 1 for the heat sink 3. Heat can be therefore transferred from the semiconductor device 1 to the heat sink 3 more efficiently and the heat spreading effect can be enhanced markedly.

Further, because the guide portions 6 of the fitting portions 22 of the wiring member 2 can be readily confirmed from the top surface direction, not only can the assembly performance be enhanced, but also deficient assembly of the semiconductor device 1 and the wiring member 2 can be forestalled.

Second Embodiment

Figure 4:
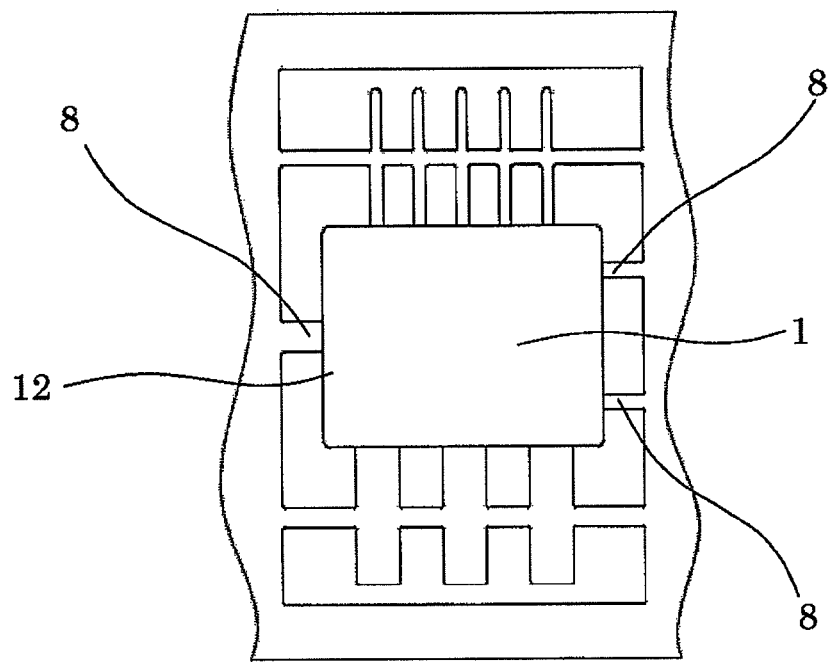
FIG. 4 is a plan view of a semiconductor device in a semiconductor apparatus according to a second embodiment of the invention.
Figure 5:
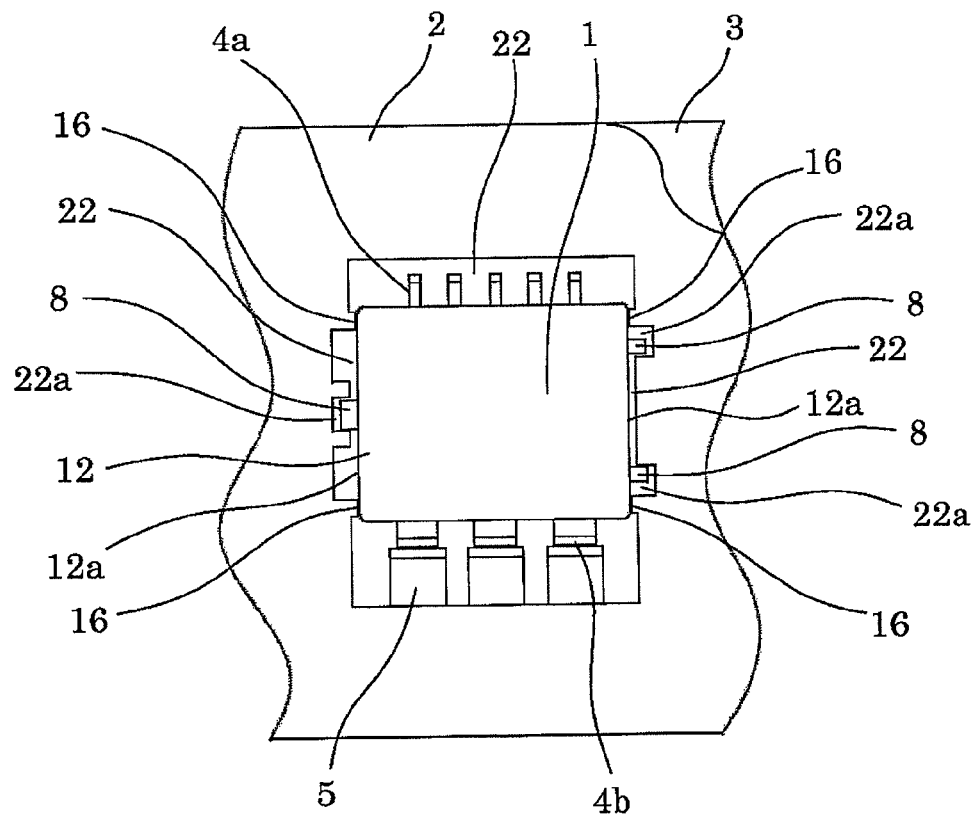
FIG. 5 is a plan view of the semiconductor apparatus according to the second embodiment of the invention.
Figure 6:
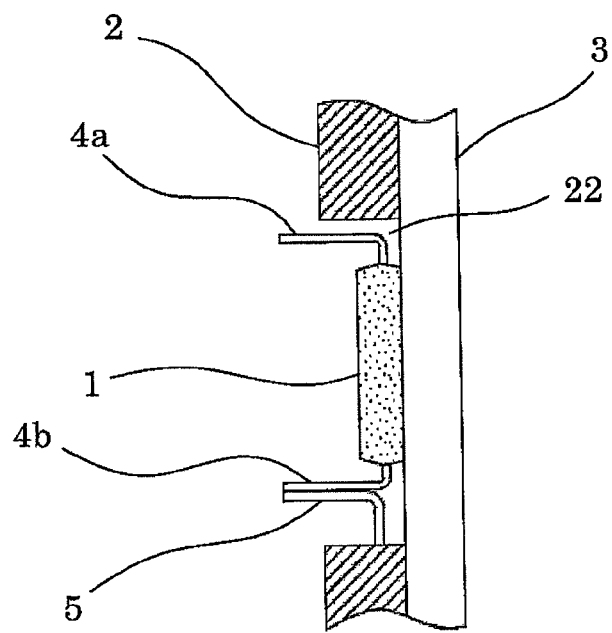
FIG. 6 is a longitudinal cross section of the semiconductor apparatus according to the second embodiment of the invention.

A second embodiment of the invention will be described on the basis of FIG. 4 through FIG. 6, and descriptions will be given by labeling same or equivalent members and portions with same reference numerals in the respective drawings. FIG. 4 is a plan view of a semiconductor device in a semiconductor apparatus according to the second embodiment of the invention. FIG. 5 is a plan view of the semiconductor apparatus according to the second embodiment of the invention. FIG. 6 is a longitudinal cross section of the semiconductor apparatus according to the second embodiment of the invention.

Referring to FIG. 4 through FIG. 6, a semiconductor device 1 in the semiconductor apparatus is of a surface mount package type and has a flat package main body 12 made of resin. Although it is not shown in the drawings, a semiconductor chip is attached inside the package main body 12 and a large number of leads made of a metal material and electrically connected to the semiconductor chip are made up of outer leads 4a and 4b extending, respectively, in two directions from the side surfaces of the package main body 12. Suspension leads 8 provided to the package main body 12 are provided to protrude from the mutually opposing side surfaces 12a of the package main body 12. A wiring member 2 is provided with guide portions 6 that correspond to the suspension leads 8 of the semiconductor device 1.

The wiring member 2 to which is connected the semiconductor device 1 is formed by molding an electric wire made of electrically conductive metal in insulating resin. The wiring member 2 is provided with fitting portions 22 in which the semiconductor device 1 is fit. By fitting the semiconductor device 1 in the fitting portions 22 provided to the wiring member 2, the semiconductor device 1 is positioned at a high degree of accuracy. Engaging portions 22a engaged with the suspension leads 8 provided to the package main body 12 are provided to the fitting portions 22 provided to the wiring member 2.

The semiconductor apparatus configured as above is fabricated as follows. That is, after the wiring member 2 provided with the fitting portion 22 and the engaging portions 22a is attached to the heat sink 3, the semiconductor device 1 is placed on the heat sink 3 by fitting the side surfaces 12a of the package main body 12 of the semiconductor device 1 in the guide portions 6 of the fitting portions 22 of the wiring member 2 and by engaging the suspension leads 8 with the engagement portions 22a. The semiconductor device 1 is then fixed with a preliminarily applied high heat-conducting adhesive.

In the second embodiment, displacement in the extending direction of the outer leads 4a and 4b is limited by the engagement of the suspension leads 8 provided to the mutually opposing side surfaces 12a of the package main body 12 with the engaging portions 22a provided to the fitting portions 22 of the wiring member 2, and displacement in the extending direction of the suspension leads 8 is limited by the fitting of the side surfaces 12a of the package main body 12 in the guide portions 6 of the fitting portions 22 of the wiring member 2.

When configured in this manner, the semiconductor device 1 is positioned at a high degree of accuracy with the fitting of the two mutually opposing side surfaces 12a of the package main body 12 of the semiconductor device 1 in the guide portions 6 of the fitting portions 22 of the wiring member 2 and the engagement of the suspension leads 8 provided to the side surfaces 12a of the package main body 12 with the engaging portions 22a provided to the fitting portions 22 of the wiring member 2. Accordingly, there is no need to provide guide portions to the semiconductor device 1 on the side surfaces where the outer leads 4a and 4b are provided.

In other words, because it is possible to position the semiconductor device 1 by the mutually opposing two side surfaces 12a of the package main body 12 alone, the outer leads 4a and 4b can be provided to the respective side surfaces up to the edges.

In addition, the suspension leads 8, which are essential members when fabricating the semiconductor device 1, can be manufactured by transfer molding as in the related art. Hence, because neither a change in design nor additional equipment is necessary, the suspension leads 8 can be manufactured at an extremely low cost.

By making guides in an asymmetrical shape by changing the number of the suspension leads 8 or the pitch thereof between the right and left sides, should the semiconductor device 1 be placed in wrong polarities, such an error can be found as soon as it is attached. It thus becomes possible to prevent the semiconductor device 1 attached in wrong polarities from being delivered to the downstream process.

In the second embodiment, too, not only does it become possible to position the semiconductor device 1 at a high degree of accuracy, but it also becomes possible to enhance the joining accuracy and the joining workability because an amount of displacement at the joining position is extremely so small that the joining can be carried out easily. In addition, because the semiconductor device 1 is positioned by the side surfaces of the package main body 12 of the semiconductor device 1, the bottom surface of the semiconductor device 1 can be flat. It thus becomes possible to secure a larger heat transfer area of the semiconductor device 1 for the heat sink 3. The heat spreading effect can be thus enhanced markedly. Further, because the guide portions 6 of the fitting portions 22 of the wiring member 2 can be readily confirmed from the top surface direction, deficient assembly of the semiconductor device 1 and the wiring member 2 can be forestalled.

It should be appreciated that the invention is not limited to the respective embodiments described above and it goes without saying that various modifications can be made without deviating from the scope of the invention.

For example, the first embodiment above described a case where the guide portions 6 of the wiring member 2 are provided to the two side surfaces and the corners of the package main body 12 of the semiconductor device 1. The guide portions 6, however, are not limited to this configuration as long as they have a guiding shape to limit movements within the surface where the package main body 12 of the semiconductor device 1 is provided, and the same effect can be achieved, for example, by providing hook-shaped guide portions to the corners of the package main body 12 of the semiconductor device 1.

Further, in the second embodiment described above, the number of the suspension leads 8 of the semiconductor device 1 varies with the internal configuration of the semiconductor device 1 and they are not limited to the number specified in the second embodiment.

Figure 7:
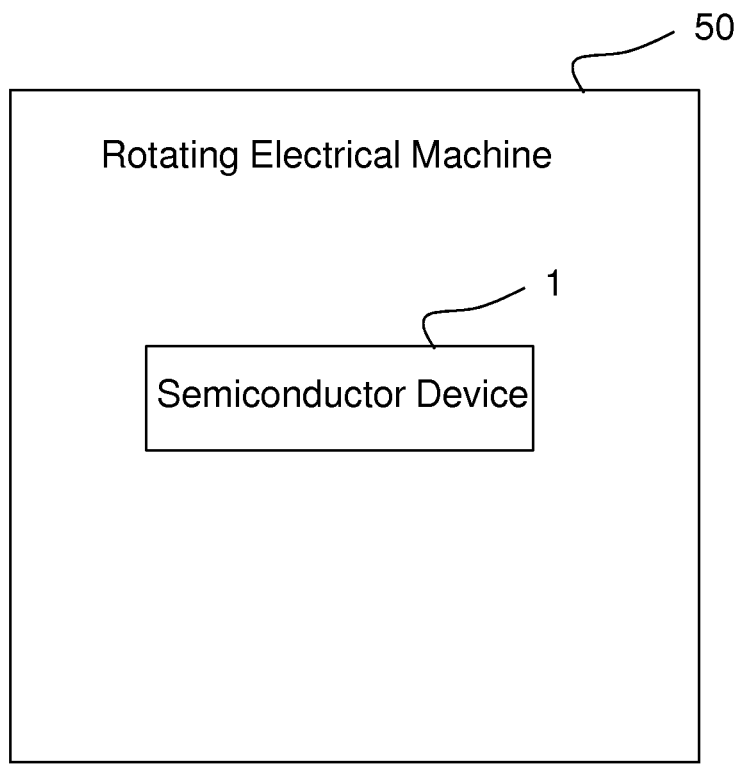
FIG. 7 is a schematic diagram showing a rotating electrical machine.

With reference to FIG. 7, the semiconductor apparatus in each of the embodiments described above can be used, for example, in a rotating electrical machine 50 incorporating a power circuit portion that performs inverter control, in particular, in a rotating electrical machine for vehicle employed in a motor-generator and for power steering. As has been described, the semiconductor apparatus in each of the embodiments described above is suitable for a rotating electrical machine for vehicle installed in an engine room where the temperature is high and dimensions are limited stringently and which is designed for a large current to flow therein, and when applied to the rotating electrical machine for vehicle, the same effects as those of each embodiment above can be achieved.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A semiconductor apparatus, comprising:
   a semiconductor device which is placed in a package to be attached to a surface of a heat sink, the package comprising suspension leads extending from opposing first side surfaces of the package, the suspension leads being asymmetrically arranged with respect to each of the opposing first side surfaces; and
   a wiring member which is attached to the heat sink and comprises a fitting portion having guide portions which comprise protrusions disposed close to corner portions of the fitting portion and engaging portions disposed between the protrusions to correspond to the suspension leads,
   wherein the package is guided into the wiring member in an orthogonal direction of the opposing first side surfaces by fitting the opposing first side surfaces onto the guide portions so that the opposing first side surfaces come into contact with the protrusions,
   the package is set onto the heat sink in an extending direction of the opposing first side surfaces by engaging the suspension leads, which are asymmetrically arranged, with respective engaging portions of the guide portions, to limit a movement of the package in the extending direction,
   the orthogonal direction of the opposing first side surfaces is a direction substantially perpendicular to the surface of the heat sink, and
   the extending direction of the opposing first side surfaces is a direction substantially perpendicular to the orthogonal direction.

2. The semiconductor apparatus according to claim 1, wherein:
   one of an electrode and a metal surface of the heat sink is exposed to a bottom surface of the package to dissipate heat generated at the semiconductor device.

3. The semiconductor apparatus according to claim 1, wherein the package comprises a surface mount package.

4. The semiconductor apparatus according to claim 1, wherein the package comprises opposing second side surfaces which are different from the opposing first side surfaces,
   the wiring member comprises an electrode, and
   the semiconductor device is electrically connected to the electrode via one of a first lead and a second lead which extend from the opposing second side surfaces of the package.

5. The semiconductor apparatus according to claim 4, wherein the electrode of the wiring member extends from a first side surface of the wiring member, and
   the engaging portions of the fitting portion of the wiring member are disposed at side surfaces of the wiring member exclusive of the first side surface.

6. The semiconductor apparatus according to claim 4, wherein the opposing second side surfaces exclude corners of the package.

7. The semiconductor apparatus according to claim 4, wherein the one of the first lead and the second lead which electrically connects with the electrode of the wiring member is directly positioned onto the electrode by fitting the opposing first side surfaces of the package into the guide portions of the wiring member.

8. The semiconductor apparatus according to claim 1, wherein the guide portions are configured in the guiding shape to limit a movement of the package on the surface of the heat sink.

9. The semiconductor apparatus according to claim 1, wherein the wiring member is attached to a same surface of the heat sink as the surface onto which the package is attachable, and
   sides of the wiring member and the surface of the heat sink define a cavity.

10. The semiconductor apparatus according to claim 1, wherein the suspension leads comprise:
    one suspension lead disposed in a center portion of one of the opposing first side surfaces of the package; and two suspension leads disposed on end portions of another one of the opposing first side surfaces of the package,
wherein an engagement of asymmetrically arranged suspension leads with the respective engaging portions of the guide portions facilitates alignment of the package within the fitting portion of the wiring member.

\* \* \* \* \*